United States Patent [19]

Kanazawa

[11] Patent Number: 5,699,050
[45] Date of Patent: Dec. 16, 1997

[54] BATTERY CAPACITY METER

[75] Inventor: Itaru Kanazawa, Kanagawa-ken, Japan

[73] Assignee: Nissan Motor Co., Ltd., Yokohama, Japan

[21] Appl. No.: 675,569

[22] Filed: Jul. 3, 1996

[30] Foreign Application Priority Data

Jul. 19, 1995 [JP] Japan ................................. 7-182812

[51] Int. Cl.$^6$ ................................................. G08B 21/00
[52] U.S. Cl. ...................... 340/636; 340/815.4; 320/48; 364/483
[58] Field of Search ................... 340/636, 815.4; 320/48, 43, 14, 12; 324/435; 364/483

[56] References Cited

U.S. PATENT DOCUMENTS

| | | | |
|---|---|---|---|
| 4,553,081 | 11/1985 | Koenck | 320/43 |
| 4,626,765 | 12/1986 | Tanaka | 320/48 |
| 5,151,865 | 9/1992 | Blessing et al. | 364/483 |
| 5,341,084 | 8/1994 | Gotoh et al. | 340/636 |
| 5,394,089 | 2/1995 | Clegg | 340/636 |
| 5,406,188 | 4/1995 | Myslinski et al. | 320/14 |
| 5,545,969 | 8/1996 | Hasegawa | 340/636 |
| 5,600,229 | 2/1997 | Oh | 320/48 |

*Primary Examiner*—Jeffery Hofsass
*Assistant Examiner*—Davetta Woods
*Attorney, Agent, or Firm*—Foley & Lardner

[57] ABSTRACT

A battery capacity meter for a battery includes a controller, a display unit for displaying a present dischargeable absolute capacity of the battery and a display light for displaying a condition of the battery under which the present dischargeable absolute capacity of the battery amounts to a maximum of chargeable absolute capacity of the battery. The present dischargeable absolute capacity and the maximum of chargeable absolute capacity of the battery are calculated on a basis of a charging or discharging current and a temperature of the battery. Since the battery capacity meter can display both of the present dischargeable absolute capacity and the maximum of chargeable absolute capacity under the temperature of the battery at charging, it is possible for a driver to confirm the chargeable absolute capacity as a residual capacity of the battery during using it. Moreover, at charging, it is possible to confirm a condition under which the charging has been completed to the maximum of chargeable capacity determined by the battery temperature at that time thereby to prevent a shortage for the full-charging.

6 Claims, 5 Drawing Sheets

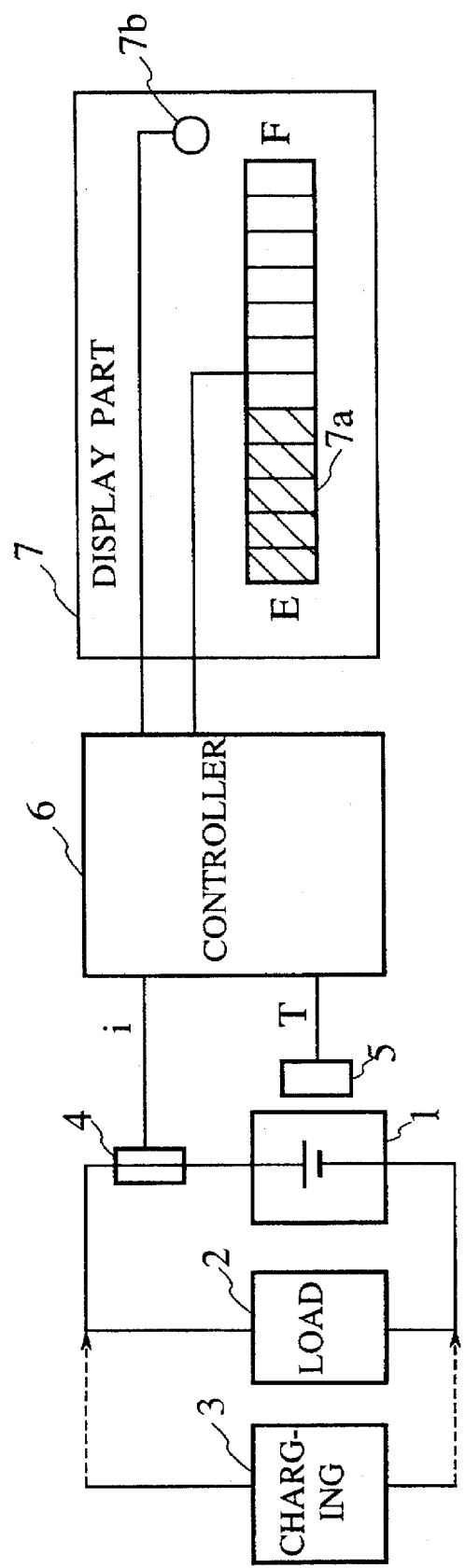

BATTERY CAPACITY METER

BACKGROUND OF THE INVENTION

The present invention relates to a battery capacity meter which is capable of displaying charge and discharge capacity of a battery.

There is known a battery capacity meter which displays a residual capacity of a battery. FIGS. 1A and 1B show respective displaying forms of the conventional battery capacity meter. In the battery capacity meter, a capacity displaying part thereof consists of a plurality of displaying segments. These segments are adapted in a manner that, all segments are switched off in case of zero (empty) in residual capacity of the battery, while all segments between scale letters "E" and "F" are switched-on in case that the battery is full-charged.

FIG. 1A shows an example of displaying the residual capacity of the battery in use, lighting the segments at the level of (a) in response to the present residual capacity. Also, FIG. 1B shows an example of displaying the charge capacity at the end of charging the battery at T °C. in battery temperature, lighting the segments at the level (b) corresponding to the charge capacity under the battery temperature of T °C.

It is generally known that the charge capacity of the battery depends on the temperature, in detail, the more the battery temperature rises, the more the charge capacity is increased. However, dependent on kinds of batteries, there are some batteries which might be damaged if the inside temperature at charging is too high. Therefore, it is a normal circumstance that the charging for a battery is executed below the maximum permissible inside temperature.

When charging the battery at the maximum permissible inside temperature, the full-charging condition can be realized, so that all of segments between the scale letters "E" and "F" light up. However, when the battery temperature at charging is less than the maximum permissible inside temperature, the full-charging condition cannot be realized as shown in FIG. 1B. Thus, it is impossible to charge the battery in excess of its chargeable capacity depending on the battery temperature at the charging.

FIGS. 2A and 2B designate other examples on display of the conventional battery capacity meter. In the displaying examples, all segments are adapted so as to light up at the completion of charging as shown in FIG. 2B, while the battery capacity in use is adapted so as to be displayed as a ratio (c/d×100%) of the residual capacity (c) to the battery capacity (d) at the completion of charging.

In the former battery capacity meter, however, since the battery capacity on display at the completion of charging varies dependent on the battery temperature, it is impossible to judge whether or not the battery has been charged to the maximum of chargeable capacity under the battery temperature at charging. Thus, as the case may be, a charging operation may be finished without reaching up to the maximum of chargeable capacity.

On the other hand, in the latter battery capacity meter, since the battery capacity varies dependent on the battery temperature at charging, it is impossible to know how much electricity the battery is charged actually in spite that all segments in the range (d) are lighting up, in other words, to detect the absolute value of charge capacity of the battery. In addition, since the residual capacity is displayed as a ratio to the charge capacity, it is also impossible to know the absolute value of dischargeable electricity despite knowing that the segments in the range (c) are lighting up. Again, it is impossible to guess a traveling distance from the residual capacity on display.

SUMMARY OF THE INVENTION

It is therefore an object of the present invention to provide a battery capacity meter which, in use, is capable of displaying the residual capacity of a battery by the dischargeable absolute capacity value of electricity, while, in charging, expressing a state under which the battery has been charged to the maximum of chargeable capacity determined by the battery temperature at charging.

The object of the present invention described above can be accomplished by a battery capacity meter for a battery, comprising:

a first display means for displaying a present dischargeable absolute capacity of the battery; and a second display means for displaying a maximum of chargeable absolute capacity of the battery at a temperature of the battery at charging.

In the present invention, it is preferable that the battery capacity meter further comprises a current sensor for detecting charging or discharging current of the battery and a temperature sensor for detecting the temperature of the battery and that the present dischargeable absolute capacity of the battery is calculated on a basis of the charging or discharging current and the temperature of the battery, while a maximum of chargeable absolute capacity of the battery is also calculated on a basis of the charging or discharging current and the temperature of the battery.

Preferably, the first display means comprises a controller to which the charging or discharging current and the temperature of the battery are inputted and a display unit which is composed of a plurality of display segments and activated by the controller so as to light up the display segments in proportion to the present dischargeable absolute capacity and preferably, the second display unit comprises the controller and a display light which is activated by the controller so as to light when the present dischargeable absolute capacity of the battery amounts to the maximum of chargeable absolute capacity of the battery.

According to the present invention, there is also provided a battery capacity meter for a battery, comprising:

a first display means for displaying a present dischargeable absolute capacity of the battery; and a second display means for displaying a maximum of chargeable absolute capacity of the battery, the maximum being defined by a temperature of the battery at charging.

In the above-mentioned battery capacity meter, preferably, it further comprises a current sensor for detecting charging or discharging current of the battery and a temperature sensor for detecting the temperature of the battery and preferably, the present dischargeable absolute capacity of the battery is calculated on a basis of the charging or discharging current and the temperature of the battery, while the maximum of chargeable absolute capacity of the battery is also calculated on a basis of the charging or discharging current and the temperature of the battery.

More preferably, the first display means comprises a controller to which the charging or discharging current and the temperature of the battery are inputted and a display unit which is composed of a plurality of display segments and activated by the controller so as to light up the display segments in proportion to the present dischargeable absolute capacity, and wherein the second display unit comprises the controller and a plurality of display lights which are positioned corresponding to some of the display segments, respectively.

The above and other features and advantages of this invention will become apparent, and the invention itself will best be understood, from a study of the following description and appended claims, with reference had to the attached drawings showing a preferred embodiment of the invention.

BRIEF DESCRIPTION OF THE DRAWINGS

FIG. 3 is a diagram showing a battery capacity meter in accordance with a first embodiment of the present invention;

DESCRIPTION OF THE PREFERRED EMBODIMENT

Figure 1A:
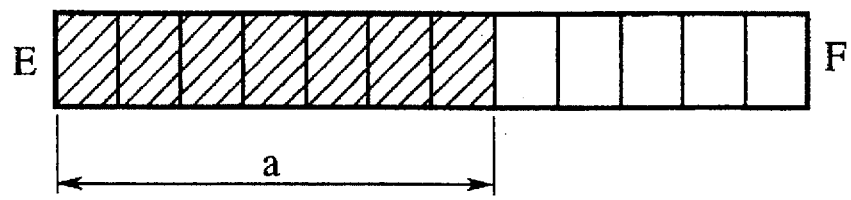
FIG. 1A is a diagram showing an example of displaying in the conventional battery capacity meter.
Figure 1B:
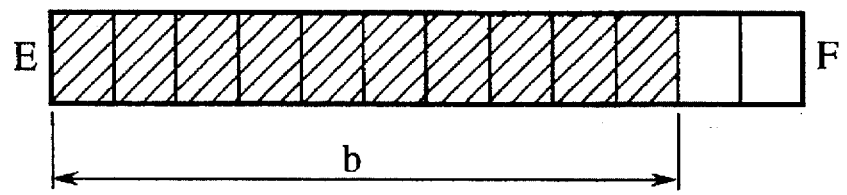
FIG. 1B is a diagram showing another example of displaying in the conventional battery capacity meter of FIG. 1A.
Figure 2A:
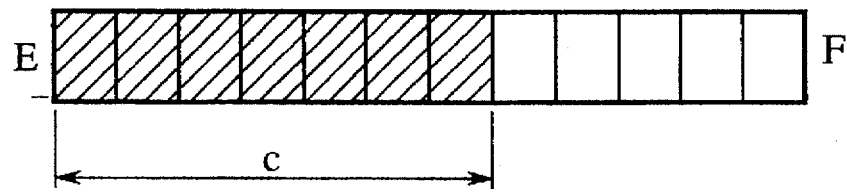
FIG. 2A is a diagram showing an example of displaying in the conventional battery capacity meter.
Figure 2B:
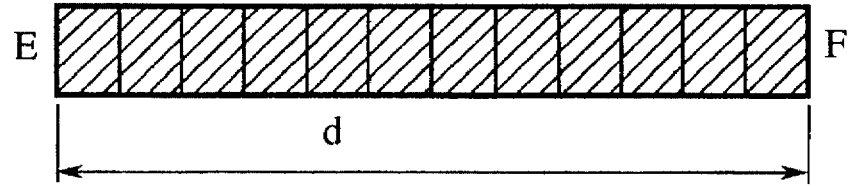
FIG. 2B is a diagram showing another example of displaying in the conventional battery capacity meter of FIG. 1A.

Two embodiments of the present invention will be described with reference to the drawings.

A first embodiment

FIG. 3 shows a block diagram of a battery capacity meter in accordance with the first embodiment of the present invention. Note, in the embodiment, we describe the battery capacity meter, giving an example by a battery capacity meter to be mounted on an electric vehicle.

Reference numeral 1 designates a battery which supplies an electric power to a variety of electric loads (only one shown in FIG.) 2. When charging the battery 1, a charging unit 3 is connected to the battery 1. A current sensor 4 detects a charging/discharging current i (A) of the battery 1, while a temperature sensor 5 detects a temperature T (°C.) of the battery 1. Note, it is preferable to detect a "inside" temperature of an interior of the battery 1 as the battery temperature.

Being constituted by a micro-computer and its peripheral parts, a controller 6 serves to calculate respective absolute values of the chargeable capacity and the dischargeable capacity of the battery 1 on the basis of both of the charging or discharging current i and the battery temperature T detected by the sensors 4, 5 and then, the controller 6 controls operations of a display part 7. The display part 7 includes a display unit 7a composed of a plurality of display segments and a display light 7b. The display unit 7a displays the chargeable absolute capacity of the battery 1, while the display light 7b indicates to the outside a condition of the battery 1 under which the battery 1 has been charged up to the maximum of chargeable capacity determined by the battery temperature T (°C.) of the battery 1 at charging.

It should be noted that, in the electric automobile, the battery 1 on use is charged in the regenerative mode of a traveling motor, i.e., in the mode where the traveling motor as a generator serves to regenerate the battery. However, normally, a charging amount brought by the regenerating energy of the motor on use is not in excess of a discharging amount of the battery to be converted into the traveling energy of the automobile. Therefore, in this embodiment, it would not be executed to calculate the chargeable capacity and to control the lighting of the display light 7b for displaying the completion of charging during using the battery 1.

Figure 4:
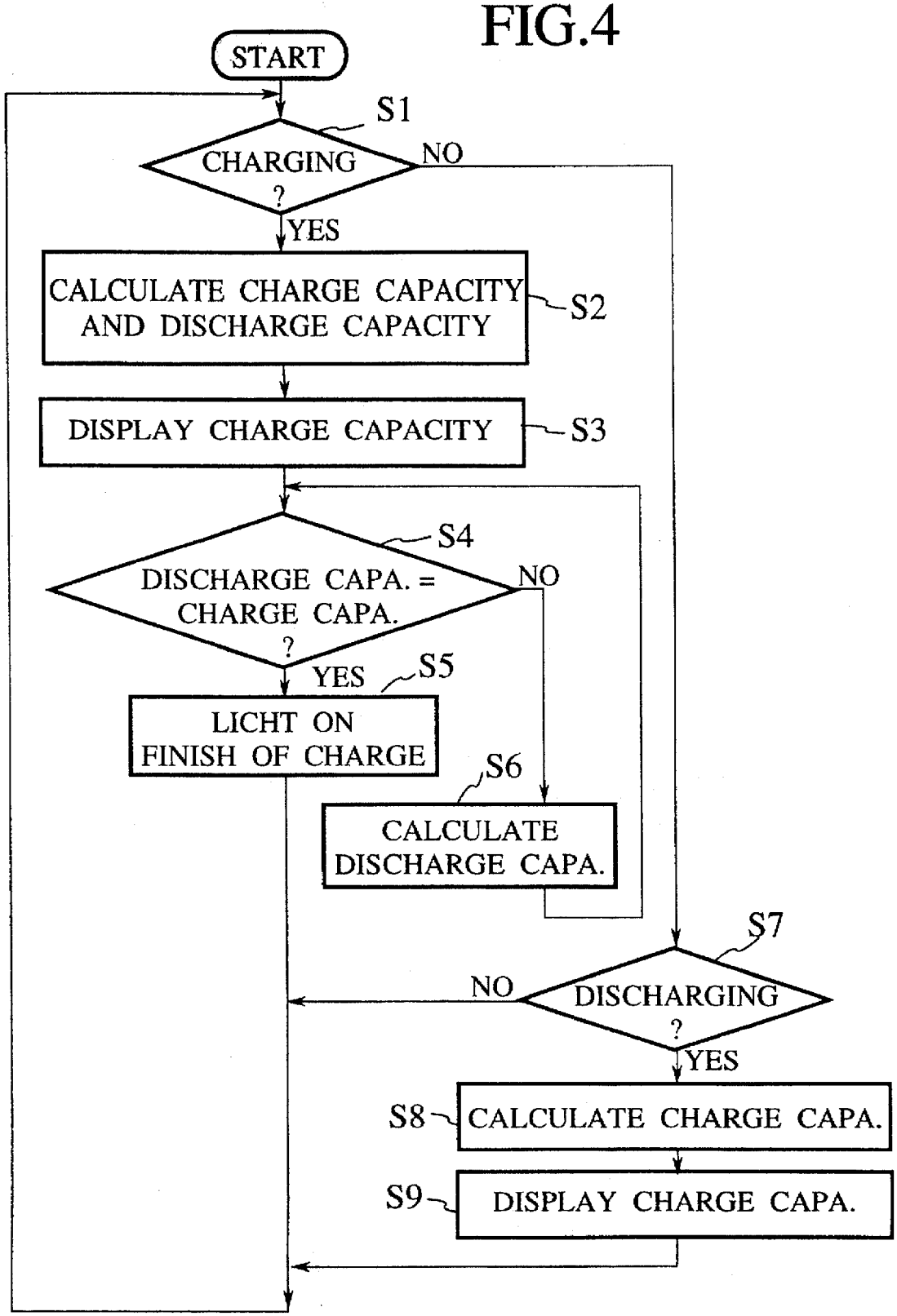
FIG. 4 is a flow chart for executing a process of displaying the battery capacity of the battery capacity meter of FIG. 3.

FIG. 4 is a flow chart for the controller 6 to execute a process to display the battery capacity.

At step S1, it is judged whether or not the battery 1 is now charged while connecting to the charger 3. If the battery 1 is now on charge, the routine goes to step S2. At step S2, based on the charging or discharging current i detected by the current sensor 4 and the battery temperature T detected by the temperature sensor 5, it is executed to calculate the chargeable absolute capacity of the battery 1 at the battery temperature of T (°C.) and the dischargeable absolute capacity of the battery 1, in other words, an absolute value of the charge capacity at present. At subsequent step S3, it is executed to light the number of segments of the display unit 7a proportional to the present dischargeable absolute capacity calculated.

Then, at step S4, it is judged whether or not the dischargeable absolute capacity (the absolute value of the charge capacity) amounts to the chargeable absolute value under the battery temperature of T (°C). When the judgement at step S4 is Yes, that is, if the charging has been finished, the routine goes to step S5 where the display light 7b is turned on. While, if the charging has not been finished yet (No), the routine goes to step S6 where the dischargeable absolute capacity (the absolute value of the charge capacity) is calculated on the basis of the charging or discharging current i detected by the current sensor 4 and the battery temperature T detected by the temperature sensor 5, and thereafter, the routine returns to step S4.

Returning to step S1, when the battery 1 is not at charging, then the routine goes to step S7 where it is judged whether or not the battery 1 is at discharging. Since the polarity of charging current i detected by the current sensor 4 at charging differs from the polarity of discharging current i detected by the current sensor 4 at discharging, the judgement at step S7 may be attained by detecting the polarity of the charging or discharging current i. In case of discharging (Yes), the routine goes to step S8 where the dischargeable absolute capacity is calculated on the basis of the charging or discharging current i detected by the current sensor 4 and the battery temperature T detected by the temperature sensor 5. At subsequent step S9, it is executed to light the number of segments of the display unit 7a proportional to the calculated dischargeable absolute capacity. Thereafter, the routine returns to step S1, so that the above-mentioned processes will be repeated.

In this way, in case of charging the battery 1, based on the charging or discharging current i and the battery temperature T, the chargeable absolute capacity of the battery 1 at the battery temperature of T (°C.) and the dischargeable absolute capacity of the battery 1, in other words, the absolute value of the charge capacity of the battery 1 at present are calculated, so that the absolute value of the charge capacity is displayed on the display unit 7a. Further, when the dischargeable absolute capacity amounts to the chargeable absolute capacity at T (°C.) in battery temperature of the battery 1 at charging, the "charge-completion" display light 7b will be turned on. On the other hand, during discharging the battery 1, upon calculating on the basis of the charging or discharging current i and the battery temperature T, the dischargeable absolute capacity is displayed on the display unit 7a.

Consequently, it is possible for a driver to confirm the chargeable absolute capacity as a residual capacity of the battery during use of the battery. In particular, since the chargeable absolute capacity of the battery is proportional to a traveling distance in the electric automobile, it is possible to estimate the traveling distance easily. Moreover, at charging, it is possible to confirm a condition under which the charging has been completed to the maximum of chargeable capacity determined by the battery temperature at that time to thereby prevent a shortage for the full-charging.

A second embodiment

Figure 5:
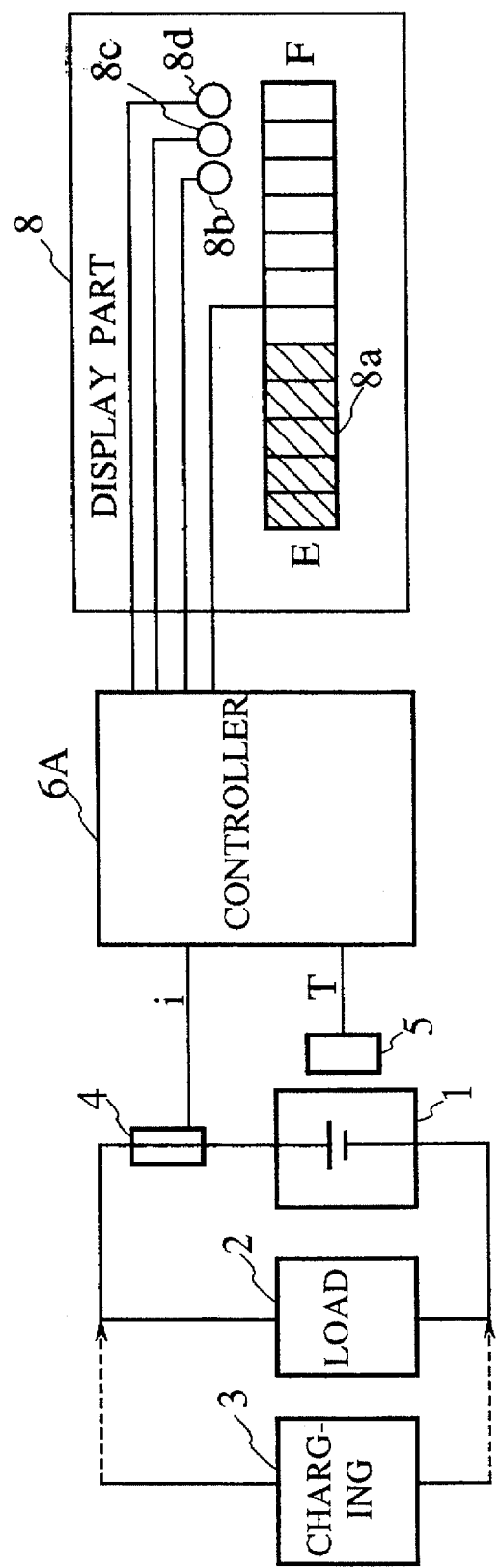
FIG. 5 is a diagram showing a battery capacity meter in accordance with a second embodiment of the present invention.

FIG. 5 shows a block diagram of a battery capacity meter in accordance with the second embodiment of the present invention. Also in this embodiment, a description is given of the battery capacity meter, giving an example by the battery capacity meter to be mounted on the electric vehicle. Further, in the embodiment, elements similar to those in the first embodiment are indicated with the same reference numerals and therefore, differences between these embodiments are mainly described hereinafter.

Figure 6:
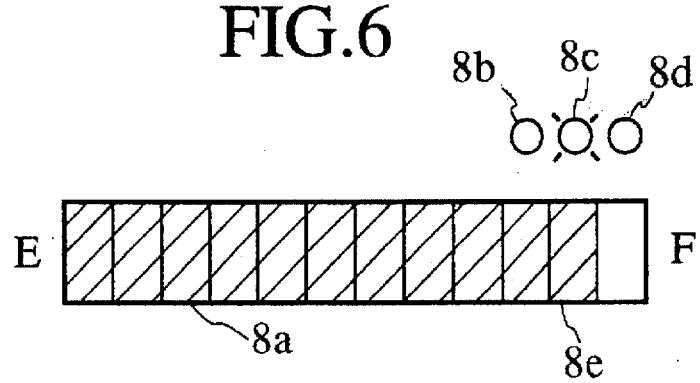
FIG. 6 is a diagram showing an example of displaying in the battery capacity meter of FIG. 5.

The display part 8 includes a display unit 8a composed of a plurality of display segments and respective display lights 8b, 8c, 8d. The display unit 8a displays the chargeable absolute capacity of the battery 1, which is equal to the absolute value of the charging capacity at charging. Also, the display lights 8b, 8c, 8d display the chargeable absolute capacity at a condition under which the battery 1 has been charged up to the maximum of chargeable capacity determined by the battery temperature T (°C.) at charging. The display lights 8b, 8c, 8d are arranged in respective positions corresponding to three segments on the side of "F" in the display unit 8a. At charging, when the battery 1 is charged up to the maximum of chargeable capacity determined by the battery temperature T (°C.), the display unit 8a is adapted so as to light up to the segments corresponding to the lighted light which is any one of the lights 8b, 8c and 8d. For example, as shown in FIG. 6, if the segment 8e of the display unit 8a is lighted under condition that the display light 8c is lighting corresponding to the chargeable capacity, such a lighting form enables the driver to recognize that the battery 1 is now charged up to the maximum of chargeable capacity determined by the battery temperature T (°C.) at charging.

Being constituted by a micro-computer and its peripheral parts, a controller 6A calculates the chargeable absolute capacity and dischargeable absolute capacity of the battery 1 of the battery temperature T (°C.) at charging on the basis of both charging or discharging current i and battery temperature T detected by the sensors 4, 5 and then controls an operation of a display part 7 in response to the calculation result.

Figure 7:
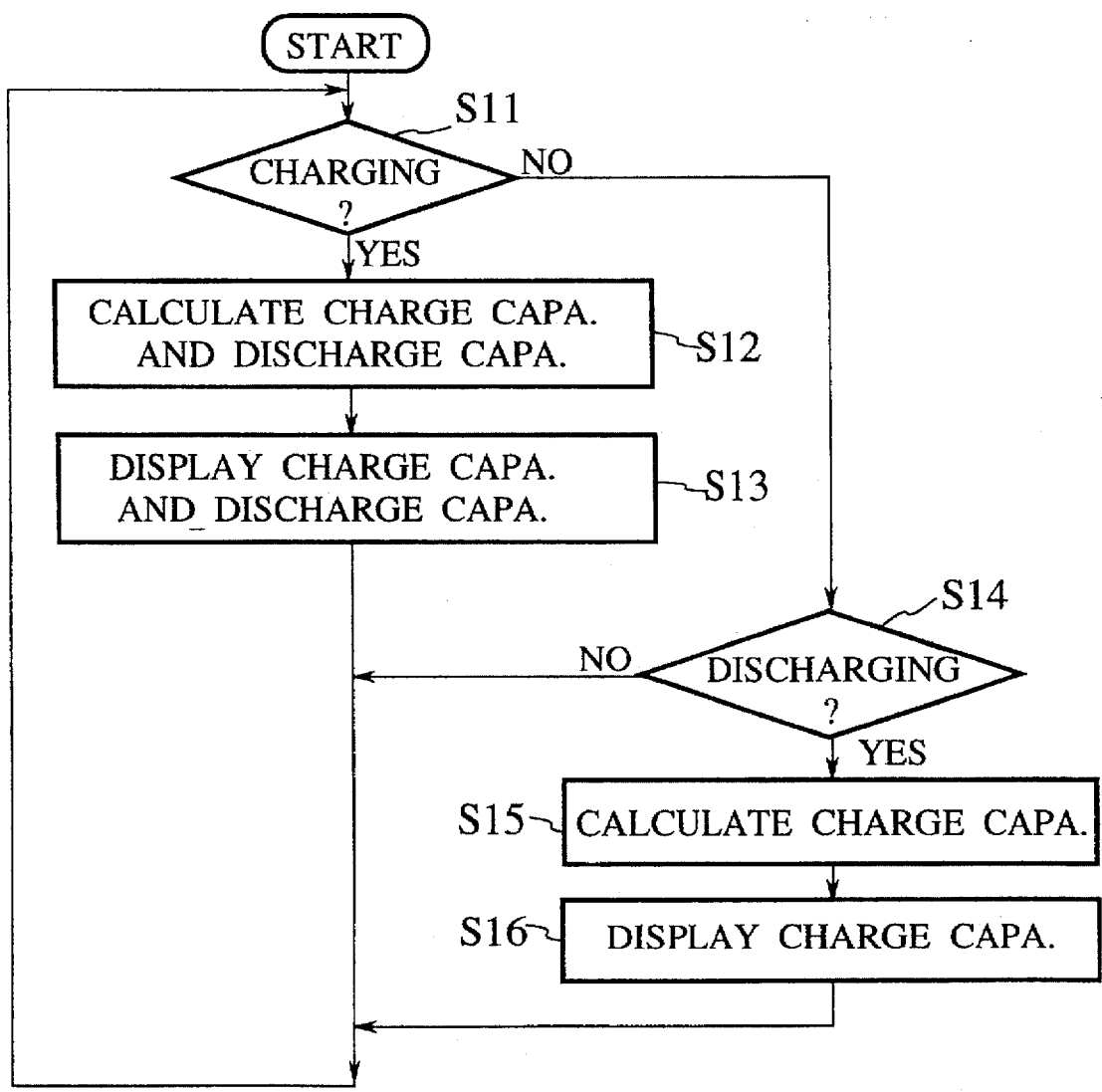
FIG. 7 is a flow chart for executing a process of displaying the battery capacity of the battery capacity meter of FIG. 5.

FIG. 7 is a flow chart for the controller 6A to execute a process to display the battery capacity.

At step S11, it is judged whether or not the battery 1 is now charged while connecting to the charger 3. If the battery 1 is now on charge, the routine goes to step S12. At step S12, based on the charging or discharging current i detected by the current sensor 4 and the battery temperature T detected by the temperature sensor 5, it is executed to calculate the chargeable absolute capacity under the battery temperature of T (°C.) and the dischargeable absolute capacity, in other words, an absolute value of the charge capacity at present. At subsequent step S13, it is executed to light the number of segments of the display unit 8a proportional to the present dischargeable absolute capacity calculated and to light any one of the lights 8b, 8c, 8d corresponding to the calculated chargeable absolute capacity.

Returning to step S11, when the battery 1 is not at charging, then the routine goes to step S14 where it is judged whether or not the battery 1 is at discharging. Since the polarity of charging current i detected by the current sensor 4 at charging differs from the polarity of discharging current i detected by the current sensor 4 at discharging, the judgement at step S14 may be attained by detecting the polarity of the charging or discharging current i. In case of discharging (Yes), the routine goes to step S15. On the contrary, when it is not discharging (No), the routine goes to step S11.

At step S15, the dischargeable absolute capacity is calculated on the basis of the charging or discharging current i detected by the current sensor 4 and the battery temperature T detected by the temperature sensor 5. At subsequent step S16, it is executed to light the number of segments of the display unit 8a proportional to the calculated dischargeable absolute capacity. Thereafter, the routine returns to step S11, so that the above-mentioned processes will be repeated.

In this way, in case of charging the battery 1, the chargeable absolute capacity under the battery temperature of T (°C.) and the dischargeable absolute capacity, in other words, an absolute value of the charge capacity at present are calculated on the basis of the charging or discharging current i and the battery temperature T, so that the absolute value of the charge capacity is displayed on the display unit 8a, while the chargeable absolute capacity under the battery temperature at the time of charging is displayed on any one of the display lights 8b, 8c and 8d. Additionally, during discharging the battery 1, the dischargeable absolute capacity is calculated and displayed on the display unit 8a, based on the charging or discharging current i and the battery temperature T.

Consequently, it is possible for a driver to confirm the chargeable absolute capacity as a residual capacity of the battery during use of the battery. In particular, since the chargeable absolute capacity of the battery is proportional to a traveling distance in the electric automobile, it is possible to estimate the traveling distance easily. Moreover, at charging, it is possible to confirm a condition under which the charging has been completed to the maximum of chargeable capacity determined by the battery temperature at that time to thereby prevent a shortage for the full-charging.

Finally, it will be understood by those skilled in the art that the foregoing description is preferred embodiments of the disclosed battery capacity meter, and that various changes and modifications may be made to the present invention without departing from the spirit and scope thereof.

In connection, it should be noted that the numbers of segments of the display units 7a, 8a and the numbers of display lights (8b, 8c, 8d) are not limited to the numbers of the above-mentioned embodiments.

Further, although the invention has been described with reference to the battery capacity meter to be mounted on the electric automobile, the battery capacity meter of the invention is applicable to any other apparatus besides the electric automobile.

What is claimed is:

1. A battery capacity meter for a battery, comprising:
   a first display means activated so as to light a plurality of display segments representing a present dischargeable absolute capacity of said battery; and
   a second display means activated so as to light up when said present dischargeable absolute capacity of said battery amounts to a maximum of chargeable absolute capacity of said battery at charging, said maximum of chargeable absolute capacity being determined by a temperature of said battery at charging.

2. A battery capacity meter as claimed in claim 1, further comprising a current sensor for detecting charging or discharging current of said battery and a temperature sensor for detecting an inside temperature of said battery,
wherein said present dischargeable absolute capacity of said battery is calculated on a basis of said charging or discharging current and said inside temperature of said battery, and said maximum of chargeable absolute capacity of said battery is also calculated on a basis of said charging or discharging current and said inside temperature of said battery.

3. A battery capacity meter as claimed in claim 2, wherein said first display means comprises a controller to which said charging or discharging current and said inside temperature of said battery are inputted and a display unit which includes a plurality of display segments activated by said controller so as to light up said display segments in proportion to said present dischargeable absolute capacity, and
wherein said second display means comprises said controller and a display light which is activated by said controller so as to light up when said present dischargeable absolute capacity of said battery amounts to said maximum of chargeable absolute capacity of said battery.

4. A battery capacity meter as claimed in claim 2, wherein said first display means comprises a controller to which said charging or discharging current and said inside temperature of said battery are inputted and a display unit which includes a plurality of display segments which are activated by said controller so as to light up said display segments in proportion to said present dischargeable absolute capacity, and
wherein said second display means comprises said controller and a plurality of display lights which are positioned corresponding to some of said display segments, respectively.

5. A method for determining a battery capacity of a battery, the method comprising the steps of:
a) determining whether or not the battery is currently being charged;
b) if the determination in the step a) is that the battery is currently being charged,
b1) determining an amount of one of a charging current flowing to the battery and discharging current flowing from the battery;
b2) determining an inside temperature of the battery;
b3) calculating a chargeable absolute capacity of the battery and a dischargeable absolute capacity of the battery based on the determinations made in the steps b1) and b2);
b4) lighting a first number of a plurality of lighting elements on a display based on the dischargeable absolute capacity of the battery calculated in the step b3);
b5) determining whether the dischargeable absolute capacity of the battery is equal to the chargeable absolute capacity of the battery;
b6) if the determination made in the step b5) is that the dischargeable absolute capacity of the battery is equal to the chargeable absolute capacity of the battery, lighting up a particular lighting element on the display, so as to indicate a fully charged condition of the battery at a temperature corresponding to the inside temperature of the battery;
b7) if the determination made in the step b5) is that the dischargeable absolute capacity of the battery is less than the chargeable absolute capacity of the battery, recalculating the dischargeable absolute capacity of the battery based on a present determination of the amount of one of the charging current flowing to the battery and the discharging current flowing from the battery, as well as a present determination of the inside temperature of the battery, and returning to the step b6);
c) if the determination in the step a) is that the battery is not currently being charged,
c1) determining an amount of one of the charging current flowing to the battery and the discharging current flowing from the battery;
c2) determining the inside temperature of the battery;
c3) calculating the dischargeable absolute capacity of the battery based on the determinations made in the steps c1 and c2); and
c4) displaying the dischargeable absolute capacity of the battery by lighting up a second number of the lighting elements on the display so as to indicate the dischargeable absolute capacity.

6. A method as claimed in claim 5, wherein a ratio of the second number of lighting elements being lighted up on the display as compared to a total number of lighting elements on the display is substantially equal to a ratio of the dischargeable absolute capacity as compared to a predetermined capacity of the battery, and
wherein the total number of lighting elements on the display does not include the particular lighting element for indicating the fully charged condition of the battery.

* * * * *